United States Patent [19]

Cory et al.

[11] Patent Number: 5,532,594

[45] Date of Patent: Jul. 2, 1996

[54] METHOD FOR SUPPRESSING SOLVENT RESONANCE SIGNALS IN NMR EXPERIMENTS

[75] Inventors: David G. Cory, Winchester; Werner E. Maas, Lincoln, both of Mass.

[73] Assignee: Bruker Instruments, Inc., Billerica, Mass.

[21] Appl. No.: 223,699

[22] Filed: Apr. 6, 1994

[51] Int. Cl.$^6$ .................................................. G01R 33/20
[52] U.S. Cl. .................................................... 324/307
[58] Field of Search ............................... 324/307, 309, 324/300, 312, 314; 128/653.2

[56] References Cited

U.S. PATENT DOCUMENTS

| | | | |
|---|---|---|---|
| 5,111,143 | 5/1992 | McKinnon et al. | 324/309 |
| 5,168,229 | 12/1992 | Hurd et al. | 324/307 |
| 5,204,626 | 4/1993 | Onodera et al. | 324/312 |
| 5,243,285 | 9/1993 | McKinnon et al. | 324/309 |
| 5,283,526 | 2/1994 | Spielman et al. | 324/307 |
| 5,327,085 | 7/1994 | Cory | 324/307 |

OTHER PUBLICATIONS

Bax et al, "Separation of the Different orders of NMR Multiple Quantum transitions by the use of pulsed field Gradients" Chemical Physics Letters vol. 69 No. 3 pp. 567–570 1 Feb. 1980.

Primary Examiner—Sandra L. O'Shea
Assistant Examiner—Raymond Y. Mah
Attorney, Agent, or Firm—Bookstein & Kudirka

[57] ABSTRACT

$B_1$ (RF) gradient echo pulse sequences are combined with frequency-selective pulse sequences to selectively suppress a solvent resonance signal by preventing the formation of an echo for the solvent resonance, while allowing the formation of an echo for the sample resonances under study. The RF gradient pulses may be planar or radial pulses. A pulse sequence for suppressing a solvent resonance signal in NMR experiments comprises a pair of (RF) gradient pulses which sandwich a selective inversion pulse sequence. In accordance with one embodiment of the invention, the RF gradient pulses are anti-symmetric (have opposite phase) and the selective inversion pulse sequence comprises a homogeneous frequency-selective inversion pulse, such as a $\pi$ pulse, applied in time between the two RF gradient pulses. In accordance with another embodiment of the invention, the RF gradient pulses are symmetric (have the same phase) and the selective inversion pulse sequence comprises a pulse sequence which has an excitation profile with a null at the frequency of the resonance to be suppressed.

11 Claims, 5 Drawing Sheets

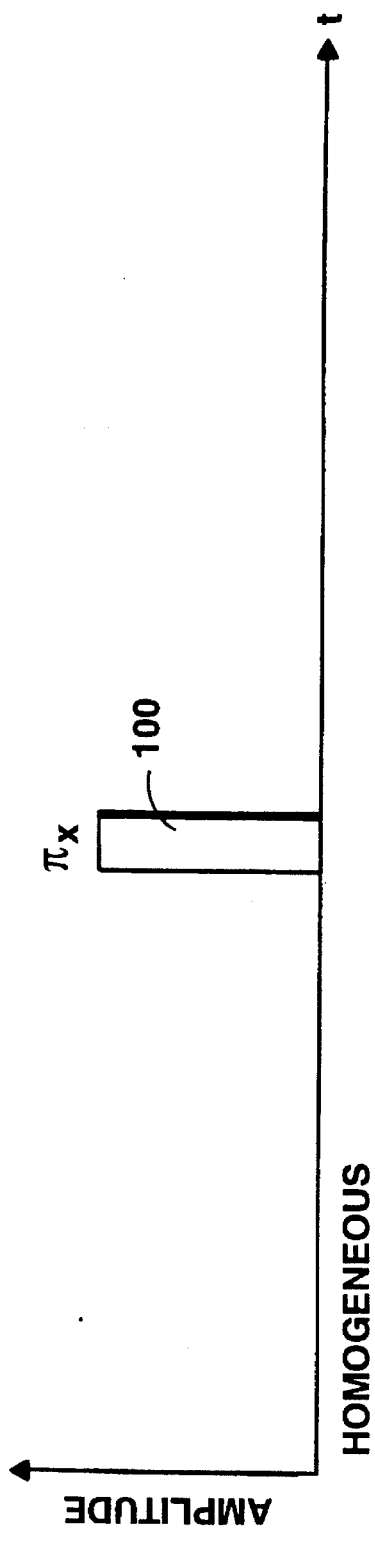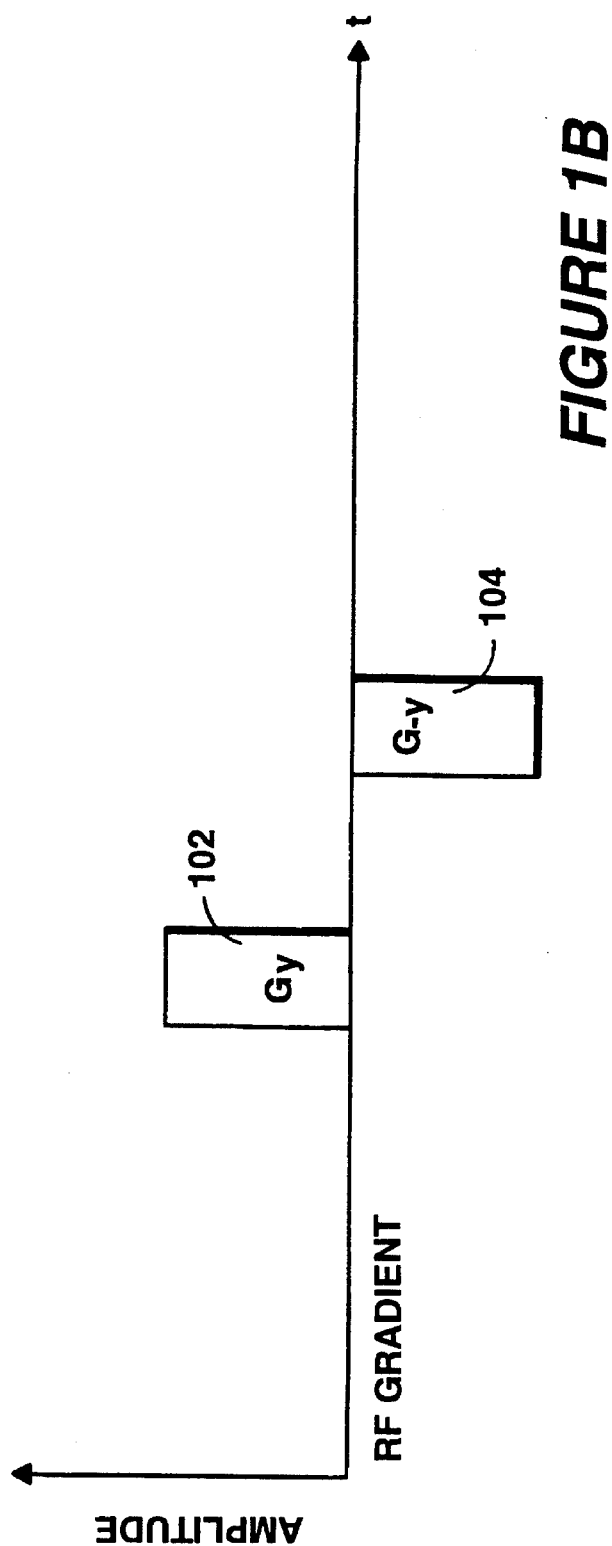

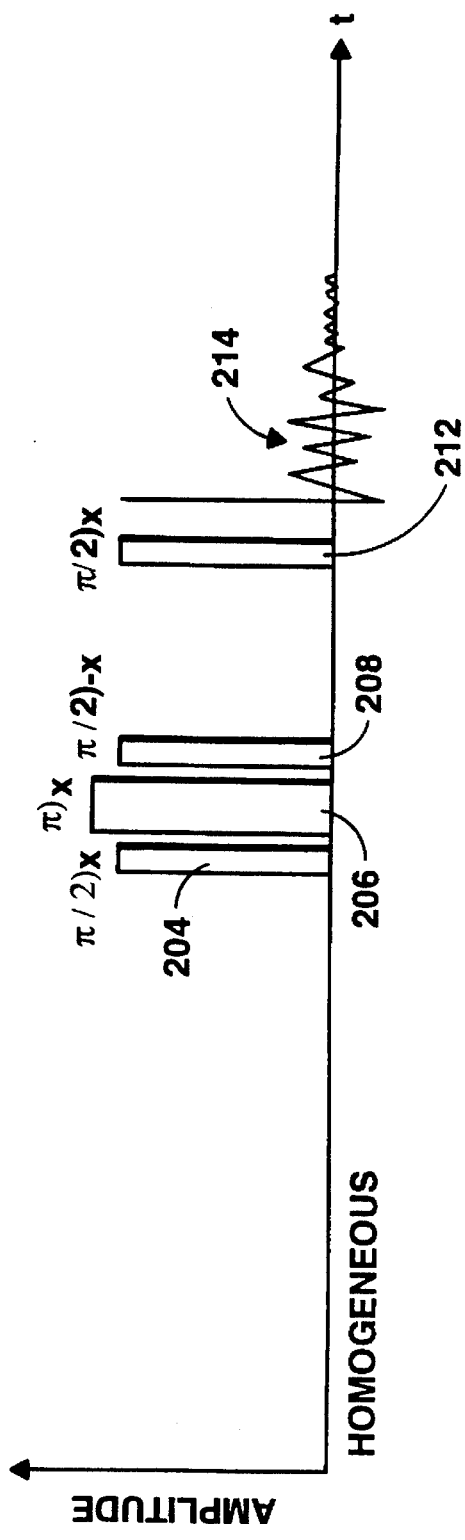
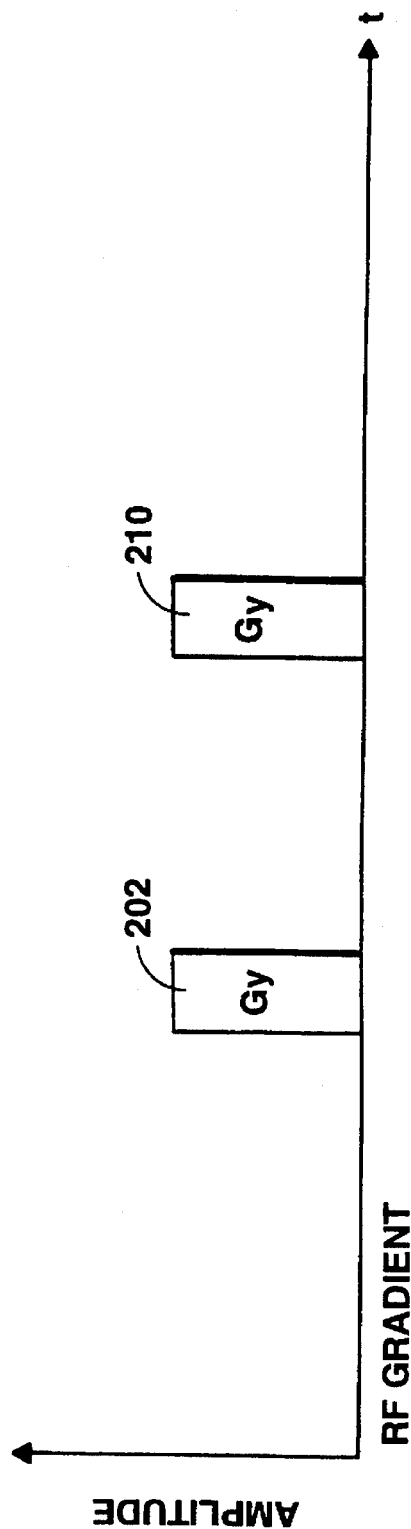

METHOD FOR SUPPRESSING SOLVENT RESONANCE SIGNALS IN NMR EXPERIMENTS

FIELD OF THE INVENTION

This invention relates to nuclear magnetic resonance (NMR) spectroscopy involving minute amounts of sample compounds dissolved in a solvent which generates a strong NMR signal, and, in particular, to NMR spectroscopy methods for suppressing the solvent signals in high resolution NMR experiments.

BACKGROUND OF THE INVENTION

All atomic nuclei of elements with an odd atomic mass or an odd atomic number possess a nuclear magnetic moment. Nuclear magnetic resonance is a phenomenon exhibited by this select group of atomic nuclei (termed "NMR active" nuclei), and is based upon the interaction of the nucleus with an applied, external magnetic field. The magnetic properties of a nucleus are conveniently discussed in terms of two quantities: the gyromagnetic ratio ($\gamma$); and the nuclear spin (I). When an NMR active nucleus is placed in a magnetic field, its nuclear magnetic energy levels are split in to (2I+1) non-degenerate energy levels, which are separated from each other by an energy difference that is directly proportional to the strength of the applied magnetic field. This splitting is called the "Zeeman" splitting and the energy difference is equal to $\hbar H_0/2\pi$ where $\hbar$ is Planck's constant and $H_0$ is the strength of the applied magnetic field. The frequency corresponding to the energy of the Zeeman splitting ($\omega_0=\gamma H_0$) is called the "Larmor frequency" and is proportional to the field strength of the magnetic field. Typical NMR active nuclei include $^1H$ (protons), $^{31}P$, $^{13}C$ and $^{19}F$. For these four nuclei I=½, and each nucleus has two nuclear magnetic energy levels.

When a bulk sample of material containing NMR active nuclei is placed within a magnetic field called the main static field, the nuclear spins distribute themselves amongst the nuclear magnetic energy levels in accordance with Boltzmann's statistics. This results in a population imbalance among the energy levels and a net nuclear magnetization. It is this net nuclear magnetization that is studied by NMR techniques.

At equilibrium, the net nuclear magnetization of the aforementioned bulk sample is aligned parallel to the external magnetic field and is static (by convention, the direction of the main static field is taken to be the z-axis of a three-axis Cartesian coordinate system). A second magnetic field perpendicular to the main static magnetic field and rotating at, or near, the Larmor frequency can be applied to induce a coherent motion of the net nuclear magnetization. Since, at conventional main static magnetic field strengths, the Larmor frequency is in the megahertz frequency range, this second magnetic field is called a "radio frequency" or RF field.

The effect of the RF field is to shift the nuclear magnetization direction so that it is no longer parallel to the main static field. This shift introduces a net coherent motion of the nuclear magnetization about the main static field direction called a "nutation". In order to conveniently deal with this nutation, a reference frame is used which rotates about the laboratory reference frame z-axis at the Larmor frequency and also has its z-axis parallel to the main static field direction. In this "rotating frame" the net nuclear magnetization, which is rotating in the stationary "laboratory" reference frame, is now static.

Consequently, the effect of the RF field is to rotate the now static nuclear magnetization direction at an angle with respect to the main static field direction (z-axis). The new magnetization direction can be broken into a component which is parallel to the main field direction (z-axis direction) and a component which lies in the plane transverse to the main magnetization (x,y plane). Since, in the transverse plane, the x and y directions are relative directions, the pulse designations x and y are used to represent relative phases of the RF field. For example, an RF pulse designated as an "x" pulse has a relative phase shift of 90° with respect to an RF pulse designated as a "y" pulse. Similarly, an RF pulse designated as an "x" pulse has a relative phase shift of 180° relative to an RF pulse designated as a −x pulse, etc. The RF field is typically applied in pulses of varying length and amplitude and, by convention, an RF pulse of sufficient amplitude and length to rotate the nuclear magnetization in the rotating frame through an angle of 90°, or $\pi/2$ radians, and entirely into the x,y plane is called a "$\pi/2$ pulse".

Because the net nuclear magnetization is rotating with respect to the laboratory frame, the component of the nuclear magnetization that is transverse to the main magnetic field or that lies in the x,y plane rotates about the external magnetic field at the Larmor frequency. This rotation can be detected with a receiver coil that is resonant at the Larmor frequency.

The receiver coil is generally located so that it senses voltage changes along one axis (for example, the x-axis) where the rotating magnetization component appears as an oscillating voltage. Frequently, the "transmitter coil" employed for applying the RF field to the sample and the "receiver coil" employed for detecting the magnetization are one and the same coil.

Although the main static field is applied to the overall material sample, the nuclear magnetic moment in each nucleus within the sample actually experiences an external magnetic field that is changed from the main static field value due to a screening from the surrounding electron cloud. This screening results in a slight shift in the Larmor frequency for that nucleus (called the "chemical shift" since the size and symmetry of the shielding effect is dependent on the chemical composition of the sample).

In a typical NMR experiment, the sample is placed in the main static field and a $\pi/2$ pulse is applied to shift the net magnetization into the transverse plane (called transverse magnetization). After application of the pulse, the transverse magnetization, or "coherence", begins to precess about the x-axis, or evolve, due to the chemical shifts at a frequency which is proportional to the chemical shift field strength. In the rotating frame, the detector (which is stationary in the laboratory frame) appears to rotate at the Larmor frequency. Consequently, the detector senses an oscillation produced by an apparent magnetization rotation at a frequency which is proportional to the frequency difference between the Larmor frequency and the chemical shift frequency.

In some NMR experiments it is assumed that the RF excitation pulse rotates the entire net magnetization into the transverse plane, even though there are differences between the Larmor frequency and the chemical shift frequency and these differences would normally cause an RF pulse with a narrow frequency response to affect the net magnetization differently. Consequently, rotation of the entire net magnetization into the transverse plane is assured by applying an RF pulse with a large amplitude and a short duration. Such a pulse has a broad frequency response and is called a "hard" RF pulse.

In other NMR experiments, a frequency-selective RF excitation pulse is desired. In these latter experiments, an RF pulse with a narrow frequency response is applied and the RF pulse rotates only the magnetization from spins where the difference between the Larmor frequency and the chemical shift frequency is a specific value. The most straightforward example of a frequency-selective pulse is a long and weak RF pulse, also called a "soft" or selective pulse.

In addition to precessing at the Larmor frequency, in the absence of the applied RF field energy, the nuclear magnetization also undergoes two spontaneous processes: (1) the precessions of various individual nuclear spins which generate the net nuclear magnetization become dephased with respect to each other so that the magnetization within the transverse plane loses phase coherence (so-called "spin-spin relaxation") with an associated relaxation time, $T_2$ and (2) the individual nuclear spins return to their equilibrium population of the nuclear magnetic energy levels (so-called "spin-lattice relaxation") with an associated relaxation time, $T_1$, The decaying oscillating signal is called a free induction decay (FID).

Further, although many NMR experiments are designed such that the spin dynamics are uniform through the sample, there are cases where it is advantageous to impose a spatial heterogeneity across the sample. Some examples of these latter cases include imaging experiments, diffusion experiments, coherence transfer experiments (where the heterogeneity may be used as a means of allowing a variation in coherence pathways), and multiple-quantum filtering experiments. All of these experiments can be performed with a spatial heterogeneity created by applying a spatially-varying magnetic field to the sample. Some common examples of such a spatially-varying field include $B_0$ and $B_1$ magnetic field gradients which are gradients along the direction of the main static field and in the plane transverse to the main static field direction, respectively.

It is often necessary to obtain NMR spectra from compounds that are dissolved in a solvent. If this solvent generates a strong NMR signal and the concentration of the dissolved compounds is low, then the strong solvent NMR signal may obscure or complicate the observation of the compound resonances. In particular, the obscuring of biological compound signals by water resonance signals is a very pronounced problem in proton NMR of biological systems where the water resonance signals may be 1000 to 10,000 times larger than the biological compound signals of interest. At first glance, it may appear relatively easy to remove the solvent NMR signal, which generally has a known frequency and shape, from the compound NMR signal. However, practically, such is not the case. One reason for this is that the solvent NMR signal may be so strong that it saturates either the analog receiver or the analog-to-digital converter, both of which are normally used to receive and process the overall NMR signal. This saturation introduces artifacts into the NMR signal that, in turn, cannot be easily removed and produce a useless NMR spectrum.

One prior art method for avoiding saturation of the NMR receiver components is to attenuate the overall NMR signal. The attenuation prevents the strong solvent signals from reaching the upper limits of receiver system response, but has the effect of increasing the lower detection limit of the receiver system. Consequently, small compound resonances of interest often fall under the detection limit and are not detected.

Other prior art methods for avoiding receiver system saturation involve suppressing the strong solvent NMR signals before a measurement is taken. In this manner, the small resonances can be detected without risking saturation. There are a large number of existing known techniques which are described in detail in an article entitled "Solvent Signal Suppression in NMR", M. Guéron, P. Plateau and M. Decorps, Progress in Nuclear Magnetic Resonance Spectroscopy, vol. 23, pages 135–209. These prior art techniques include presaturation, diffusion-based techniques, jump-return techniques and binomial pulse sequences.

Despite the large number of prior art solvent suppression techniques, many common problems still exist. For example, presaturation and diffusion-based techniques prevent the observation of exchangeable protons, while methods which rely on jump-return or on binomial pulse sequences lead to signals with frequency dependent phases and/or amplitude variations over the spectra. Further, the latter methods are often accompanied by a baseline distortion.

In experiments where gradients can be used, one prior art approach to overcoming some of the problems with prior art solvent suppression techniques uses $B_0$ gradients in combination with selective excitation pulses and is described in detailed in a paper entitled "Gradient Tailored Excitation for Single-Quantum NMR Spectroscopy of $H_2O$ Solutions", M. Piotto, V. Saudek and V. Sklenár, Journal of Biomolecular Nuclear Magnetic Resonance, vol. 2, page 661. As described in this paper, good solvent signal suppression can be achieved with a gradient spin echo sequence which includes both a selective inversion pulse which inverts the solvent resonance and a hard inversion pulse which inverts all resonances. In particular, the selective inversion pulse is split into two selective pulses, which are arranged to sandwich a hard $\pi$ inversion pulse of opposite phase. When this pulse sequence is applied, the solvent resonance will experience no net rotation and will be dephased, while the solute resonances experience a $\pi$ rotation, and will be refocussed by the second gradient pulse.

Although each of the solvent suppression techniques discussed above has advantages, all of the techniques also have disadvantages. For example, in addition to the aforementioned problems encountered with prior art solvent suppression techniques, the occurrence of radiation damping is also known to significantly reduce the performance of known solvent suppression techniques. Techniques involving $B_0$ gradients in addition suffer from artifacts caused by the use of $B_0$ gradients, such as eddy currents, disturbance of the magnetic field locking system and the need to allow for long delays in the NMR experiment to switch the $B_0$ gradients on and off. Also, during the time required for the application of the $B_0$ gradients, the spin magnetization loses phase coherence due to spin-spin relaxation, which loss in phase coherence results in a loss of signal intensity.

Accordingly, it is an object of the present invention to provide a solvent suppression technique that is insensitive to the aforementioned problems encountered with existing techniques.

It is another object of the present invention to provide a solvent suppression technique which can be used in experiments that require a gradient field.

SUMMARY OF THE INVENTION

The foregoing problems are overcome and the foregoing objects are achieved in an illustrative embodiment of the invention in which $B_1$ (RF) gradient echo pulse sequences are combined with frequency-selective pulse sequences to selectively suppress a solvent resonance signal by preventing the formation of an echo for the solvent resonance, while allowing the formation of an echo for the sample resonances under study. The RF gradient pulses may be planar or radial pulses.

In accordance with the principles of the invention, a pulse sequence for suppressing a solvent resonance signal in NMR experiments comprises a pair of (RF) gradient pulses which sandwich a selective inversion pulse sequence. In accordance with one embodiment of the invention, the RF gradient pulses are anti-symmetric (have opposite phase) and the selective inversion pulse sequence comprises a homogeneous frequency-selective inversion pulse, such as a $\pi$ pulse, applied in time between the two RF gradient pulses.

In accordance with another embodiment of the invention, the RF gradient pulses are symmetric (have the same phase) and the selective inversion pulse sequence comprises a pulse sequence which has an excitation profile with a null at the frequency of the resonance to be suppressed, which pulse sequence is applied in time between the two RF gradient pulses.

In accordance with yet another embodiment of the invention the RF gradient pulses are symmetric (have the same phase) and the selective inversion pulse sequence comprises a frequency-selective $\pi$ pulse at the resonance frequency of the spins to be suppressed and a uniform $\pi$ pulse which is applied to the entire spectrum.

In accordance with a further embodiment of the invention, two radial RF gradient pulses are used which sandwich a frequency selective inversion pulses sequence comprised of two sub-sequences each of which, in turn, comprises a frequency-selective $\pi$ pulse at the resonance frequency of the spins to be suppressed and a uniform $\pi$ pulse which is applied to the entire spectrum and where the phases of the two inversion pulse sub-sequences differ by 90°.

BRIEF DESCRIPTION OF THE DRAWINGS

FIGS. 1A and 1B are diagrams of an inventive solvent suppression RF pulse sequence which can be used with planar gradients.

FIGS. 2A and 2B are diagrams of another inventive solvent suppression RF pulse sequence which can be used with planar gradients.

DETAILED DESCRIPTION OF THE PREFERRED EMBODIMENTS

Figure 3A:
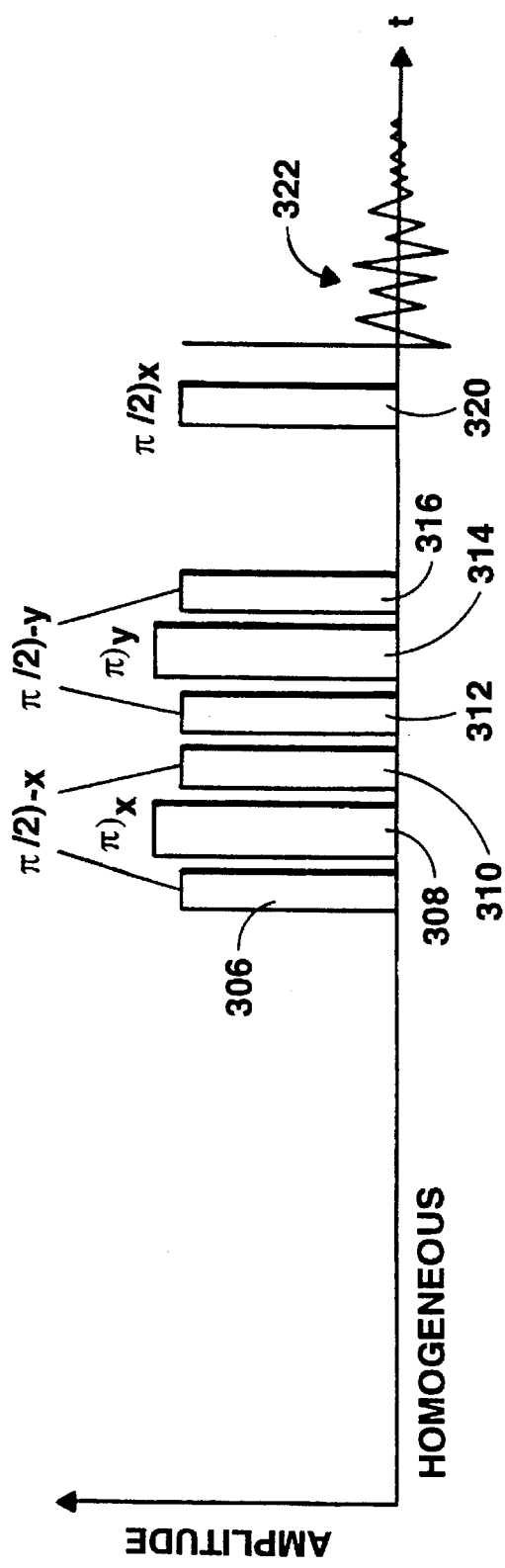
FIGS. 3A and 3B are diagrams of an inventive solvent suppression RF pulse sequence which can be used with non-planar gradients.

In accordance with the principles of the invention, solvent resonance suppression is achieved by combining $B_1$ (RF) gradients with selective inversion pulse sequences. Pulse sequences constructed in accordance with the principles of the invention are designed to form RF gradient spin echo sequences or RF gradient recalled echo sequences using RF gradients for the gradient pulses so that the echo can be detected. As discussed in detail below, these RF gradient echo sequences are combined with frequency-selective inversion pulses to selectively suppress a solvent resonance signal by preventing the formation of an echo for the solvent resonance, while allowing the refocussing of the sample resonances under study.

Illustratively, as shown in FIGS. 1A and 1B, an inventive anti-symmetric pulse sequence can be constructed by sandwiching a homogeneous inversion pulse, such as a $\pi$ pulse 100, between two RF gradient pulses, 102 and 104. FIG. 1A illustrates the RF pulses applied to the NMR sample by means of a homogeneous coil, while FIG. 1B illustrates gradient pulses applied to the sample by means of an RF, or $B_1$ gradient coil. The pulse sequence shown in FIGS. 1A and 1B works by creating an echo using the RF gradient pulses and selectively suppressing the echo for the solvent resonances using the homogeneous pulse. The pulse sequence uses planar RF gradients which have a constant phase over the sample so that the variation of the RF field over the sample is only an amplitude variation.

More particularly, the result of the application of a gradient field is a rotation of the spin magnetization in a plane perpendicular to the rotating frame axis along which the gradient interaction is directed. The rotation angle is a function of the spatial location of the spins. If a gradient field is applied for a sufficient time and has a sufficient strength, the total magnetization acquires a continuous distribution of spatially-dependent rotation angles and is no longer detectable with a simple readout pulse using a conventional homogenous receiver coil. The magnetization is then said to be "dephased".

This dephased magnetization can be refocussed to form a "gradient echo", at which point in time, the spatial dependency is canceled. Consequently, the magnetization can be detected with a homogeneous coil. One way to form a gradient echo is to apply a first gradient field to the spin system followed by a second gradient field which is inverted relative to the first field. This pulse sequence produces a "gradient recalled echo" or, in the case of a $B_1$ gradient, a "rotary echo".

In the pulse sequence shown in FIGS. 1A and 1B, a rotary echo is formed by the gradient pulses 102 and 104. The gradient pulse 102 has a phase y and when it is applied to a spin system in equilibrium, that is, the spin density matrix is proportional to $I_z$, the spin magnetization will be rotated into the xz-plane. However, due to the application of a gradient field, within the xz-plane, the magnetization will be dispersed or dephased in the rotating frame and cannot be observed with a simple readout pulse. This dephased magnetization can be rephased to form a rotary echo which can be observed by applying the same gradient pulse with an opposite phase, such as pulse 104.

The $\pi$ pulse 100 interferes with the formation of the gradient recalled echo which would normally be created by the two gradient RF pulses, 102 and 104. If the inversion pulse 100 is frequency-selective, then only that magnetization corresponding to nuclei with frequencies outside the bandwidth of the selective pulse will refocus, while nuclei with resonances within the bandwidth of the selective pulse will be dephased. Consequently, if the inversion pulse 100 is chosen so that it selectively inverts the solvent resonance frequencies, the solvent resonances will be dephased.

Another way to form a gradient echo is to apply a first gradient field, invert the spin magnetization with a hard inversion pulse, and then apply a second gradient field which is equivalent to the first gradient field. This latter technique produces a type of echo called a "gradient spin echo". For example, the dephased magnetization produced by the application of planar RF gradient pulse with phase y (the initial RF gradient pulse 102 in FIG. 1B) can also be refocussed as a gradient spin echo by following the initial planar RF gradient pulse with a homogeneous $\pi_x$ inversion pulse followed by a another RF gradient pulse with the same phase as the first gradient RF pulse.

This latter pulse sequence can also be used for solvent resonance suppression by preventing spin echo formation for the solvent resonances. For example, echo formation can be disrupted by replacing the broadband, or hard, inversion pulse in the symmetric echo sequence described above with an inversion pulse, or pulse sequence, which has an excitation profile with a null at the frequency of the solvent resonance to be suppressed. An illustrative inversion pulse sequence which is suitable for use with this inventive symmetric pulse sequence is a square wave excitation sequence described in detail in a paper entitled "NMR Spectra of Exchangeable Protons Using Uniform Excitation Solvent Suppression Pulse Sequences", C. Wang and A. Pardi, Journal of Magnetic Resonance, vol. 71, pages 154–158. When this selective inversion pulse is inserted into the pulse sequence, the second RF gradient will then refocus only magnetization from spins which experience the inversion pulse; the magnetization from spins that resonate at the null of the excitation profile will experience the same gradient twice and will be dispersed throughout the xz-plane.

Alternatively, in order to use the aforementioned symmetric pulse sequence for solvent resonance suppression, the single hard inversion pulse can be replaced by a pair of inversion pulses: a selective $\pi$ pulse at the resonance frequency of the spins to be suppressed and a hard $\pi$ pulse which is applied to the entire spectrum. In this latter symmetric pulse sequence, the spins that resonate at the frequency at which the selective $\pi$ pulse is applied will either experience no net rotation, if the selective $\pi$ inversion pulse has a phase opposite to that of the uniform $\pi$ inversion pulse, or a $2\pi$ rotation, if the selective $\pi$ pulse has the same phase as the phase of the uniform $\pi$ pulse. In both cases, only the inverted magnetization is refocussed, while the magnetization of spins that resonate at the frequency of the selective pulse is dephased in the xz-plane. For practical purposes, it is advantageous to split the selective $\pi$ pulse into two selective $\pi/2$ pulses which can be arranged to "sandwich" the uniform $\pi$ pulse.

FIGS. 2A, 2B show such an illustrative pulse sequence constructed in accordance with the principles of the invention for a single scan solvent suppression experiment. The pulse sequence shown in FIGS. 2A and 2B also uses a planar RF gradient. In particular, FIG. 2A illustrates the RF pulses applied to the NMR sample by means of a homogeneous coil, while FIG. 2B illustrates the pulses applied to the sample by means of an RF, or $B_1$ gradient coil. Both FIGS. 2A and 2B represent relative amplitudes of the RF energy versus time. In the pulse sequence, an RF gradient pulse, 202, is applied to the sample. Gradient pulse 202 has a phase y ($G_y$) and is followed by an inversion pulse sequence comprised of selective pulses 204 and 208 and uniform inversion pulse 206. The selective inversion pulses 204 and 208 are $\pi/2$ pulses with a phase $-x$ and the uniform inversion pulse is a $\pi$ pulse with the opposite phase (x). The inversion pulse sequence is followed by a second RF gradient pulse 210 which has the same phase ($G_y$) as the previous RF gradient pulse 202. The gradient pulse 210 is followed by a $(\pi/2)_x$ readout pulse 212 which causes the FID 214 to be generated.

In the case of both inventive solvent resonance suppression pulse sequences discussed above, the spin magnetization is refocussed along the direction of the static magnetic field and can be observed with a simple readout pulse. The magnetization is refocussed along the +z axis of the rotating frame in the anti-symmetric case mentioned above, and along the −z-axis in the symmetric case. A signal can then be observed by applying a readout pulse to rotate the refocussed magnetization into the xy-plane and then observing the resulting FID with a homogeneous detection coil. The signal which is to be suppressed (corresponding to the solvent resonances) which is dispersed in the xz-plane by the inventive pulse sequences, is also rotated into the xy-plane by the readout pulse but it is not observable with the homogeneous detection coil.

Alternatively, the latter illustrative pulse sequence can also be used with non-planar RF gradients. For example, a non-planar RF gradient may be a quadrupolar (or radial) RF gradient field in which both the phase and the amplitude of the RF field are spatially dependent. In such a field, the phase varies over $2\pi$ in a plane perpendicular to the direction of the main magnetic field, while the amplitude in this plane increases linearly with radius, passing through zero at the center of the sample. This quadrupolar RF gradient field is described in detail in, and may illustratively be generated by a novel probe which is also described in detail in, a copending application entitled "An Improved NMR Probe Which Includes $B_1$ Gradient Coils", filed on Mar. 12, 1993 by David G. Cory, Frank H. Laukien and Werner E. Maas, under Ser. No. 08/030,693 and assigned to the same assignee as the present invention, which application is hereby incorporated by reference.

Such a quadrupolar RF gradient has some definite advantages over a planar RF gradient. In particular, the dephasing due to a planar gradient is in a plane perpendicular to the rotating frame axis along which the gradient RF field is applied. In the case of a quadrupolar RF gradient, the dephasing is the result of both an amplitude and phase distribution, scattering the magnetization over the surface of a sphere rather than in a plane. Also, due to the radial phase distribution, the gradient phase does not have to be adjusted to the phase of the homogeneous coil. Finally, a quadrupolar coil can generally be made more efficient than other gradient coil configurations, since the effective filling factor is higher.

However, due to the spatially-dependent phase of the radial RF gradient, when such a field is used with the inventive solvent resonance suppression sequence illustrated in FIGS. 2A and 2B, only half of the magnetization is refocussed, resulting in a signal reduction of one-half. The full signal can be recovered by sequentially inverting both the x and y components of the magnetization using the pulse sequence depicted in FIGS. 3A and 3B.

Figure 3B:
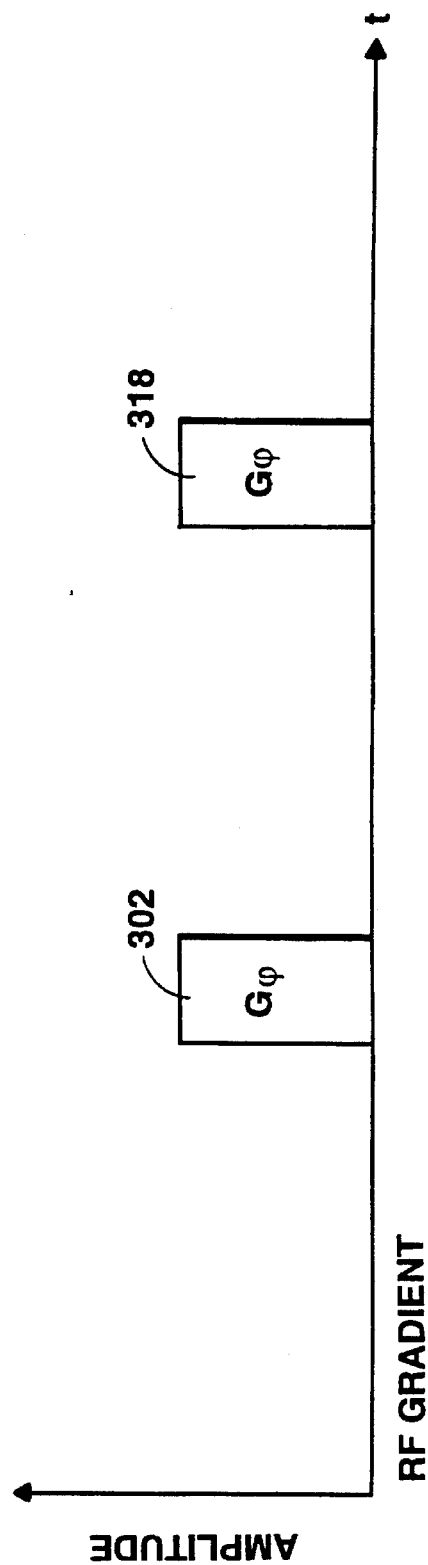

FIG. 3A illustrates the RF pulses applied to the NMR sample by means of a homogeneous coil, while FIG. 3B illustrates the pulses applied to the sample by means of an RF, or $B_1$ gradient coil which generates radial gradient fields as discussed above. Both FIGS. 3A and 3B represent relative amplitudes of the RF energy versus time. Next, in the pulse sequence, a radial RF gradient pulse, 302, is applied to the sample. Gradient pulse 302 has a spatially varying phase indicated by $\phi$ ($G_\phi$) and is followed by a double inversion pulse sequence comprised of a first inversion pulse sub-sequence including selective pulses 306 and 310 and uniform inversion pulse 308. The selective inversion pulses 306 and 310 are $\pi/2$ pulses with a phase $-x$ and the uniform inversion pulse 308 is a $\pi$ pulse with the opposite phase (x). The first inversion pulse sub-sequence is followed by a second inversion pulse sub-sequence comprising pulses 312, 314 and 316. The selective inversion pulses 312 and 316 are π/2 pulses with a phase −y and the uniform inversion pulse 314 is a π pulse with the opposite phase (y).

The second inversion pulse sub-sequence is, in turn, followed by a second RF gradient pulse 318 which is also a radial pulse ($G_\phi$) like the previous RF gradient pulse 302. The gradient pulse 318 is followed by a $\pi/2)_x$ readout pulse 320 which causes the FID 322 to be generated. Whereas, in the planar gradient case (illustrated in FIGS. 2A and 2B) the magnetization is refocussed along $-I_z$, in the quadrupolar RF gradient echo case (illustrated in FIGS. 3A and 3B) the magnetization is focused along $+I_z$.

Figure 4:
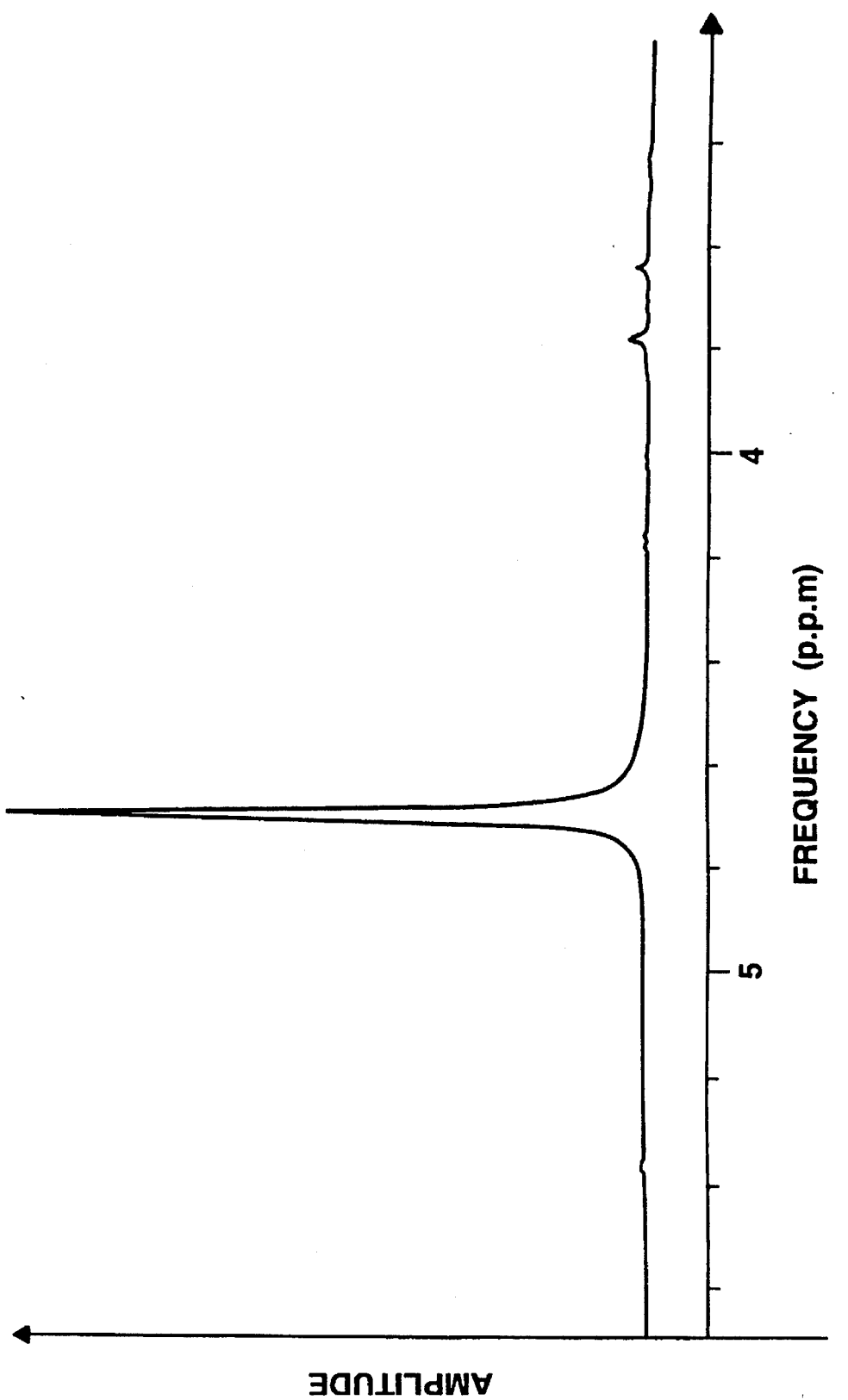
FIG. 4 is a proton NMR spectrum of sucrose in water, acquired after a single RF pulse in a system in which solvent resonances are not suppressed.
Figure 5:
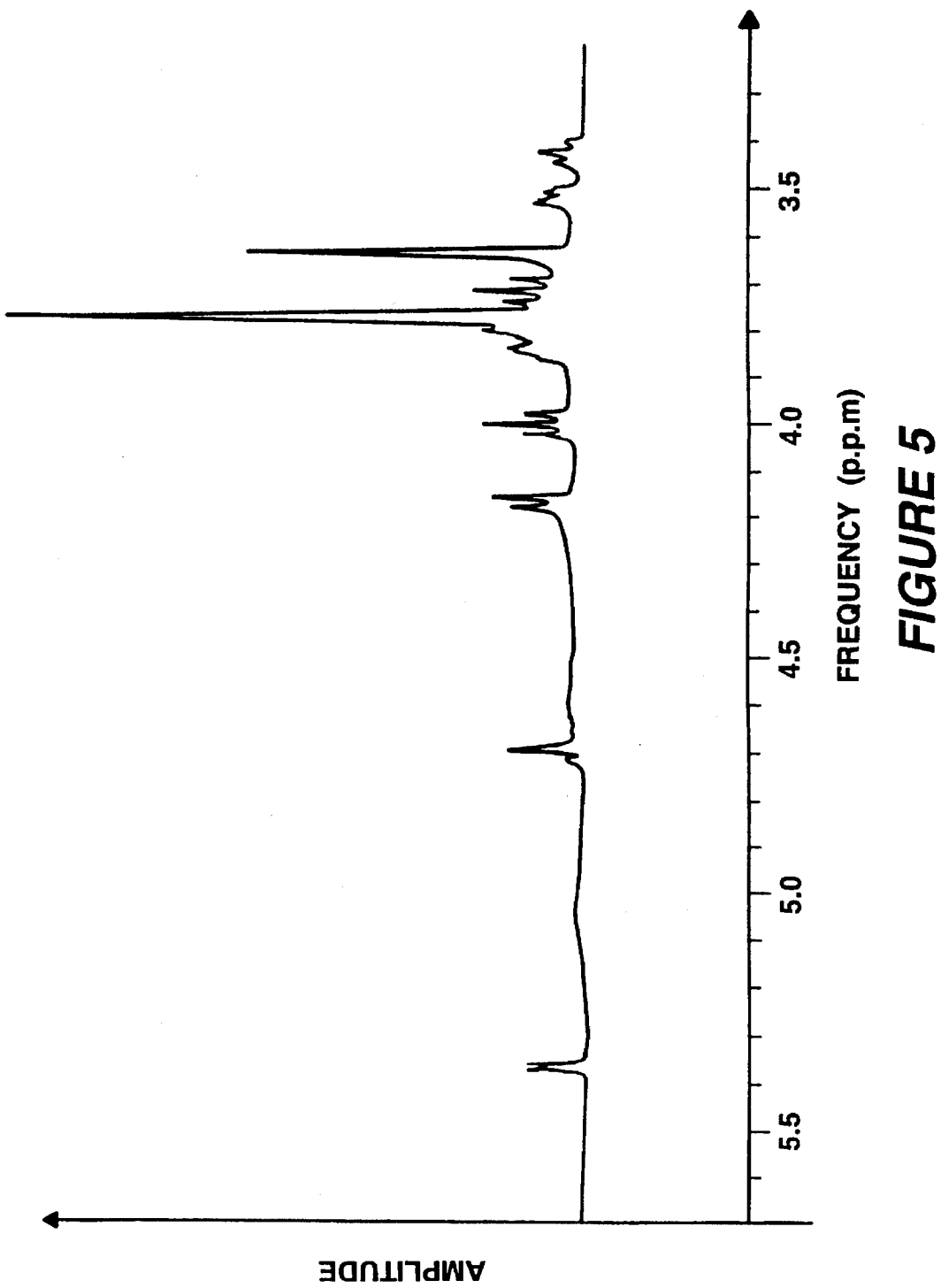
FIG. 5 is a proton NMR spectrum of sucrose in water, acquired after the application of the solvent suppression sequence diagrammed in FIGS. 3A and 3B.

FIGS. 4 and 5 show NMR spectra of sucrose in a water solvent. These spectra were obtained with a prototype $B_1$-gradient probe (described in the aforementioned patent application Ser. No. 08/030,693) which generates a quadrupolar field. The probe was operating on a model AMX-400 widebore NMR spectrometer sold by Bruker Instruments, Inc., 19 Fortune Drive, Manning Park, Billerica, Mass. and operating at a proton resonance frequency of 400 MHz. The spectrum of FIG. 4 is a single pulse excitation spectrum where the water resonance signals have not been suppressed, while in the spectrum of FIG. 5 the water resonance is suppressed using the inventive RF pulse sequence shown in FIGS. 3A and 3B. In FIG. 5, the radial RF gradient pulse duration was 500 µs at a gradient strength of 15 G/cm. The selective π/2 pulse durations are 2.78 ms. As can be seen from the spectra, the water resonance is well suppressed in FIG. 5.

The inventive solvent suppression pulse sequences can be used in single pulse excitation experiments, as in the pulse sequences shown in FIGS. 1A, 1B through 3A, 3B, but they can also be used as a precursor to, or incorporated into, any type of one-dimensional or multi-dimensional experiments. In particular, a quadrupolar RF gradient pulse can be expressed as a rotation with angle $\alpha(\vec{r})$ around the rotating frame axis $\phi(\vec{r})$, where both the phase angle and the pulse angle are spatially dependent. The total suppression sequence for the spins to be observed can then be expressed in terms of rotations, the total of which can be seen to equal a rotation about the z-axis with angle π in accordance with the following equation:

$$R_{\phi,\alpha} R_{x,\pi} R_{y,\pi} R_{\phi,\alpha} = R_{z,\pi}$$

The sequence can therefore be incorporated or repeated in most NMR experiments, for example, in the mixing pulse sequence of NOESY experiments.

The inventive solvent suppression sequences are generally insensitive to artifacts, such as 1) the disappearance of the resonances of exchangeable protons; 2) phase distortions; 3) chemical shift evolution; 4) J-modulation; 5) off-resonance excitation effects and 6) radiation damping. The total time duration of the inventive suppression sequences, typically on the order of milliseconds, should allow the observation of most exchangeable protons. The selectivity of the suppression is adjustable and determined by the bandwidth of the selective pulses. Since the observable magnetization is refocussed along the z-axis of the rotating frame, there are no phase distortions over the spectrum. Chemical shift evolution during the time needed for the selective pulses is refocussed by the hard π inversion pulse in the center of the sequence. In order to avoid J-modulation, the total time duration of the solvent suppression sequence should be kept short. The modulation terms are easily canceled by allowing a dephasing delay before the readout pulse. Both the planar and radial sequences are compensated for off-resonance excitation effects during the gradient pulses, due to their symmetry.

The use of RF gradients in solvent suppression experiments has some important advantages over the use of $B_0$ gradients. Apart from the ease of the use of RF gradients compared to $B_0$ gradients and the avoidance of artifacts related to eddy currents generated by $B_0$ gradients, the avoidance of radiation damping and the reduction in signal loss due to relaxation make the RF gradient solvent suppression sequences superior to conventional suppression sequences, in general, and to suppression sequences that use $B_0$ gradients, in particular.

Whereas the efficiency of the solvent suppression in techniques using $B_0$ gradients can be severely reduced by radiation damping, radiation damping will not affect the efficiency of the solvent suppression techniques that make use of RF gradients. The reason for this is that the solvent magnetization during and after the suppression sequence is dephased either in a plane (in the planar gradient case) or on the surface of a sphere (in the case of a quadrupolar gradient field). If a probe is used that can be rapidly switched between a homogeneous coil and a gradient coil (for example, the previously discussed probe), then immediately after the gradient pulse is applied, the gradient coil is switched off and the homogeneous coil is switched on. In this case, the transverse components of the dispersed solvent magnetization have the wrong symmetry to induce an emf in the homogeneous receiver coil and radiation damping is thereby prevented.

The RF gradient sequences differ also from the $B_0$ gradient solvent sequences (and other sequences in which the magnetization to be observed is in the transverse plane during the suppression sequence) in the relaxation behavior of the spins. In the latter sequences, the relaxation time of the spins to be observed is determined by the spin-spin relaxation time, $T_2$. However, in the RF gradient case, the magnetization rotates in a plane perpendicular to the applied RF field and the relaxation of the magnetization is governed by a combination of spin-spin and spin-lattice relaxation processes. An effective relaxation rate $1/T_{eff}$ during an RF gradient pulse can be expressed in accordance with the following equation:

$$\frac{1}{T_{eff}} = \frac{1}{2} \left( \frac{1}{T_1} + \frac{1}{T_2} \right)$$

Since the spin-lattice relaxation time, $T_1$, is usually longer than the spin-spin relaxation time, $T_2$, this effective relaxation rate is generally an advantage, since it leads to lower intensity losses in the case of RF gradient solvent suppression sequences as compared to $B_0$ gradient or other suppression sequences.

Although only a few illustrative embodiments have been described in some detail, the principles of the invention will immediately suggest other applications. For example, the principles of the invention are applicable in a manner which will be apparent to those skilled in the art to applications including but not limited to other NMR experiments.

What is claimed is:

1. A anti-symmetric composite radio-frequency pulse sequence for use in an NMR experiment having a main static magnetic field applied parallel to the z-axis, the pulse sequence destroying coherences of resonance signals which fall into a predetermined frequency range, the pulse sequence comprising:

a first $B_1$ (RF) gradient pulse having a first phase;

an inversion pulse sequence comprising at least one homogeneous frequency-selective pulse selected to invert spins having resonance signals within the predetermined frequency range; and a second $B_1$ (RF) gradient pulse having a second phase opposite to the first phase.

2. A composite radio-frequency pulse sequence according to claim 1 wherein the inversion pulse sequence comprises a homogeneous frequency-selective π pulse.

3. A symmetric composite radio-frequency (RF) pulse sequence for use in an NMR experiment having a main static magnetic field applied parallel to the z-axis, the pulse sequence destroying coherences of resonance signals which fall into a predetermined frequency range, the pulse sequence comprising:

a first $B_1$, RF gradient pulse having a first phase;

a homogeneous frequency-selective inversion pulse sequence selected to invert all spins having resonance signals which fall outside the predetermined frequency range and a second $B_1$, RF gradient pulse having a second phase equal to the first phase.

4. A composite radio-frequency pulse sequence according to claim 3 wherein the inversion pulse sequence comprises:

a first frequency-selective π/2 pulse at a resonance frequency within the predetermined frequency range, the first frequency-selective π/2 pulse having a second phase;

a hard π pulse, having a phase equal to the second phase; and a second frequency-selective π/2 pulse at a resonance frequency within the predetermined frequency range, the second frequency-selective π/2 pulse having a phase opposite to the second phase.

5. A symmetric composite radio-frequency RF pulse sequence for use in an NMR experiment having a main static magnetic field applied parallel to the z-axis, the pulse sequence destroying coherences of resonance signals which fall into a predetermined frequency range, the pulse sequence comprising:

a first $B_1$, RF gradient pulse having a first phase;

an inversion pulse sequence comprising two homogeneous frequency-selective inversion sub-sequences selected to invert all spins having resonance signals outside the predetermined frequency range, the two inversion sub-sequences having phases which differ by 90 degrees; and a second $B_1$, RF gradient pulse having a second phase equal to the first phase.

6. A composite radio-frequency pulse sequence according to claim 5 wherein the inversion pulse sequence comprises:

a first selective π/2 pulse at a resonance frequency within the predetermined frequency range, the first selective π/2 pulse having a phase x;

a hard π pulse, having a phase x;

a second selective π/2 pulse at a resonance frequency within the predetermined frequency range, having a phase −x;

a third selective π/2 pulse at a resonance frequency within the predetermined frequency range, the third selective π/2 pulse having a phase y;

a hard π pulse, having a phase y; and a fourth selective π/2 pulse at a resonance frequency within the predetermined frequency range, the fourth selective π/2 pulse having a phase −y.

7. A composite radio-frequency (RF) pulse sequence for use in an NMR experiment having a main static magnetic field applied parallel to the z-axis, the pulse sequence destroying coherences of resonance signals which fall into a predetermined frequency range, the pulse sequence comprising:

a first $B_1$, RF gradient pulse having a first phase;

an inversion pulse sequence comprising at least one homogeneous frequency-selective pulse selected to invert spins with regard to whether their spin resonance signals fall within said predetermined frequency range; and a second $B_1$, RF gradient pulse having a second phase relative to the first phase.

8. A pulse sequence according to claim 7 wherein said predetermined frequency characteristics are such that the resonance signals of the spins which the frequency-selective pulse is selected to invert are within said predetermined frequency range.

9. A pulse sequence according to claim 8 wherein the second phase is opposite to the first phase.

10. A pulse sequence according to claim 7 wherein said inversion pulse sequence is such that the resonance signals of the spins which the inversion pulse sequence is selected to invert are outside of the predetermined frequency range.

11. A pulse sequence according to claim 10 wherein the second phase is equal to the first phase.

* * * * *